United States Patent
Atami et al.

[11] Patent Number: 5,873,938
[45] Date of Patent: Feb. 23, 1999

[54] SINGLE CRYSTAL PULLING APPARATUS

[75] Inventors: Takashi Atami; Hisashi Furuya, both of Tokyo; Michio Kida, Omiya, all of Japan

[73] Assignees: Mitsubishi Materials Silicon Corporation; Mitsubishi Materials Corporation, both of Tokyo, Japan

[21] Appl. No.: 774,183

[22] Filed: Dec. 26, 1996

[30] Foreign Application Priority Data

Dec. 27, 1995 [JP] Japan ................................. 7-341699
Dec. 27, 1995 [JP] Japan ................................. 7-341703

[51] Int. Cl.⁶ ................................................. C30B 35/00
[52] U.S. Cl. .......................... 117/213; 117/214; 117/900
[58] Field of Search ................................. 117/18, 19, 20, 117/30, 31, 33, 213, 214, 900

[56] References Cited

U.S. PATENT DOCUMENTS 5,021,118  6/1991  Kawasaki ................................. 117/35
5,474,022 12/1995  Abe et al. ................................ 117/31

FOREIGN PATENT DOCUMENTS

63-303894 12/1988 Japan .
 3-40990  2/1991 Japan .
 3-295891 12/1991 Japan .
 4-305091 10/1992 Japan .

*Primary Examiner*—Felisa Garrett
*Attorney, Agent, or Firm*—Pillsbury Madison & Sutro LLP

[57] ABSTRACT

A single crystal pulling apparatus wherein a semiconductor melt is stored in an outer crucible, and a cylindrical inner crucible which acts as a partition body, is mounted inside the outer crucible to thus form a double crucible, and a single crystal of semiconductor is pulled from the semiconductor melt inside the inner crucible. The inner crucible contains a communicating portion, which is formed when the double crucible is formed, for allowing flow of the semiconductor melt into the inner crucible, and the communicating portion incorporates an arrangement for removal of gas bubbles which have adhered to the communicating portion.

26 Claims, 9 Drawing Sheets

SINGLE CRYSTAL PULLING APPARATUS

BACKGROUND OF THE INVENTION

1. Field of the Invention

The present invention relates to a single crystal pulling apparatus for pulling a single crystal of a semiconductor from a semiconductor melt stored in a double crucible.

2. Description of the Related Art

The CZ growth technique is an example of one of the currently known methods for growing single crystals of semiconductors such as silicon (Si) or gallium arsenide (GaAs).

Because this CZ growth technique enables simple generation of large diameter, high purity single crystals which are free from dislocation or have extremely low levels of lattice defect, it is widely used in the growing of a variety of semiconductor crystals.

In recent years, the demand for larger diameter, higher purity single crystals with uniform levels of oxygen concentration and impurity concentration, has seen this CZ growth technique improved in various ways, to meet these demands.

One of the improvements of the aforementioned CZ growth technique which has been proposed, is a continuous magnetic field application CZ technique (hereafter abbreviated as CMCZ technique), which employs a double crucible. Features of this method are that it enables the growth of single crystals with good slip-free ratios and with extremely good control of oxygen concentration levels, by external application of a magnetic field to the semiconductor melt inside the crucible, which suppresses convection in the semiconductor melt, and that it enables the simple generation of long single crystals of the semiconducting material by allowing continuous supply of the source materials, to a position located between outer and inner crucibles. Consequently, this method is recognized as one of the best for obtaining large diameter, long single crystals of semiconducting materials.

Figure 12:
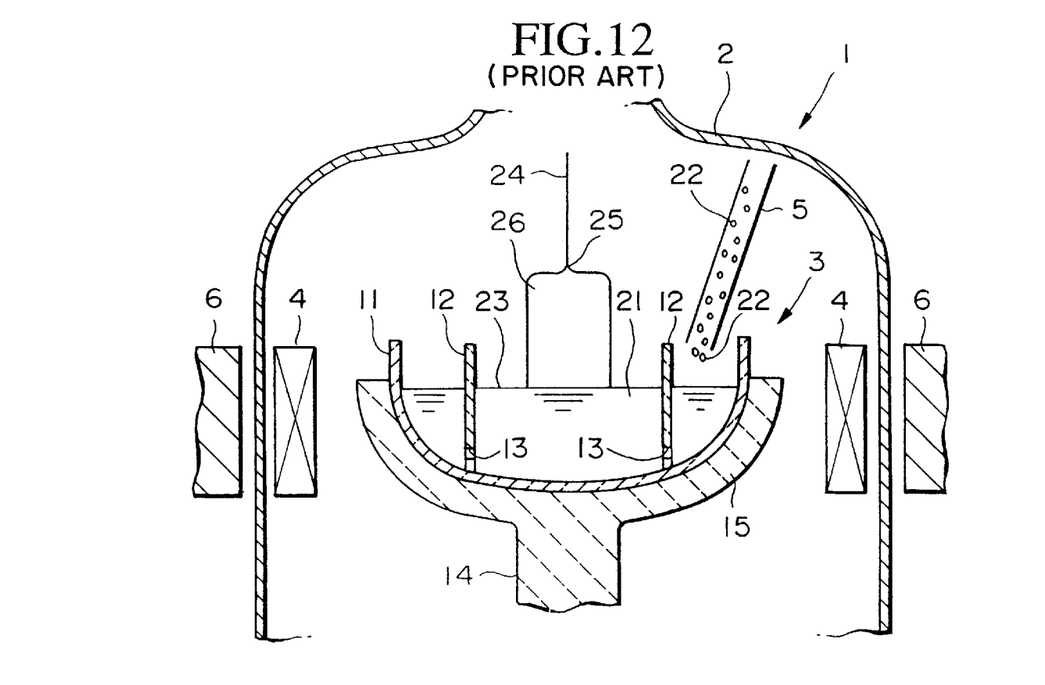
FIG. 12 (prior art) is a cross-sectional view showing an example of a conventional single crystal pulling apparatus relevant to the present invention.

FIG. 12 shows an example of a single crystal silicon pulling apparatus proposed in Japanese Patent Application, First Publication, No. Hei-4-305091, which employs the CMCZ technique outlined above. In this single crystal pulling apparatus 1, a double crucible 3, a heater 4, and a source material supply tube 5 are positioned inside a hollow air-tight chamber 2, and a magnet 6 is positioned outside this chamber 2.

The double crucible 3 comprises an approximately hemispherical outer crucible 11 made from quartz ($SiO_2$), and an inner crucible 12 made from quartz, which is a cylindrical partition body which is fitted inside the outer crucible 11. The side wall of this inner crucible 12 contains a plurality of communicating apertures 13, which connect the area between the inner and outer crucibles, 12 and 11 respectively (the source material melt region), with the inside of the inner crucible 12 (the crystal growing region).

This double crucible 3 is mounted on a susceptor 15, which sits on a vertical shaft 14 located centrally at the lower portion of the chamber 2, and can be rotated in a horizontal plane at a specified angular velocity about the axis of the shaft 14. The semiconductor melt (the source material for the generation of single crystals of semiconductor, melted by heating) 21 is stored inside this double crucible 3.

The heater 4 heats and melts the semiconductor source material inside the crucible, and also maintains the temperature of the thus produced semiconductor melt 21. Normally resistance heating is used. The source material supply tube 5 is used to continuously inject a specified volume of semiconductor source material 22, on to the surface of the semiconductor melt between the outer crucible 11 and the inner crucible 12.

The magnet 6 is used to apply, externally, a magnetic field to the semiconductor melt 21 inside the double crucible 3, and to produce Lorentz forces in the semiconductor melt 21, thereby effecting control of convection within the semiconductor melt 21, the control of oxygen concentration, and the suppression of surface vibration, and so on.

Examples of the source materials 22 which can be supplied through the source material supply tube 5 mentioned above include polysilicon which has been converted to flake form by crushing in a crusher, or polysilicon granules deposited from gaseous source material using thermal decomposition, with further supply, as necessary, of elemental additives known as dopants, such as boron (B) (in the case of production of p-type single crystals of silicon) and phosphorus (P) (in the case of production of n-type single crystals of silicon).

In the case of gallium arsenide (GaAs), the operation is the same as that outlined above, but in this case, the elemental additive used is either zinc (Zn) or silicon (Si).

With the single crystal pulling apparatus 1 outlined above, a seed crystal 25 is suspended from a pulling shaft 24 located above the inner crucible 12 and over the shaft axis line, and a single crystal of semiconductor 26 is grown at the upper surface of the semiconductor melt 21 around the nucleus of the seed crystal 25.

However, as has been disclosed in Japanese Patent Application, First Publication, No. Sho-63-303894, in this type of single crystal pulling apparatus, the growing of single crystals requires that first the polycrystalline source material, such as lumps of polysilicon, be melted, and the resulting semiconductor melt 21 stored inside the outer crucible 11, with the double crucible 3 then being formed by positioning the inner crucible 12 above the outer crucible 11 and then mounting it down onto the outer crucible 11.

The reason that the double crucible 3 is formed after melting of the polycrystalline source material, is that in order to effect complete melting of the polycrystalline source material to obtain the semiconductor melt 21, the temperature of the source material inside the outer crucible 11 needs to be raised, using the heater 4, to a temperature hotter than the single crystal growing temperature. On the other hand, if the inner crucible 12 were to be mounted on the outer crucible prior to the melting stage, large thermal deformation of the inner crucible 12 would occur.

Consequently, by mounting the inner crucible 12 on the outer crucible 11 after complete melting of the source material and a subsequent lowering in the heat being applied by the heater 4, the high temperatures required in the initial source material melting stage can be avoided, and deformation of the inner crucible 12 suppressed.

Furthermore, the communicating apertures 13 of the inner crucible 12 are set at a predetermined aperture diameter small enough to ensure that when source material is added, the semiconductor melt 21 will flow only from the outer crucible 11 to the inner crucible 12. The reason for this restriction is that if the aperture area of the apertures 13 is too large so that the phenomenon arises where, through convection, the semiconductor melt is able to flow from the crystal growing region back to the source material melt region, then the control of impurity concentrations during the single crystal growth, and the control of the melt temperature would become problematic.

However, in those situations where the diameter of the communicating apertures 13 is too small, it becomes difficult for the semiconductor melt to flow freely from outside the inner crucible 12 to the inside thereof, and thus more likely for a difference to develop between the level of the semiconductor melt outside the inner crucible 12 and the level inside the inner crucible 12, which will then produce vibrations on the melt surface as the system attempts to rectify this difference in levels, which in turn exercises a deleterious influence on the single crystal growth.

As a result, the diameters of the communicating apertures 13 described above, need to be set in a range between being sufficiently small to prevent reverse flow of the semiconductor melt 21 from inside the inner crucible 12 to the outside thereof, and sufficiently large to prevent the development of a difference in levels between the semiconductor melt inside the inner crucible 12 and the semiconductor melt outside thereof.

However, in single crystal pulling apparatus like those described above, the following type of problems remain.

Figure 13A:
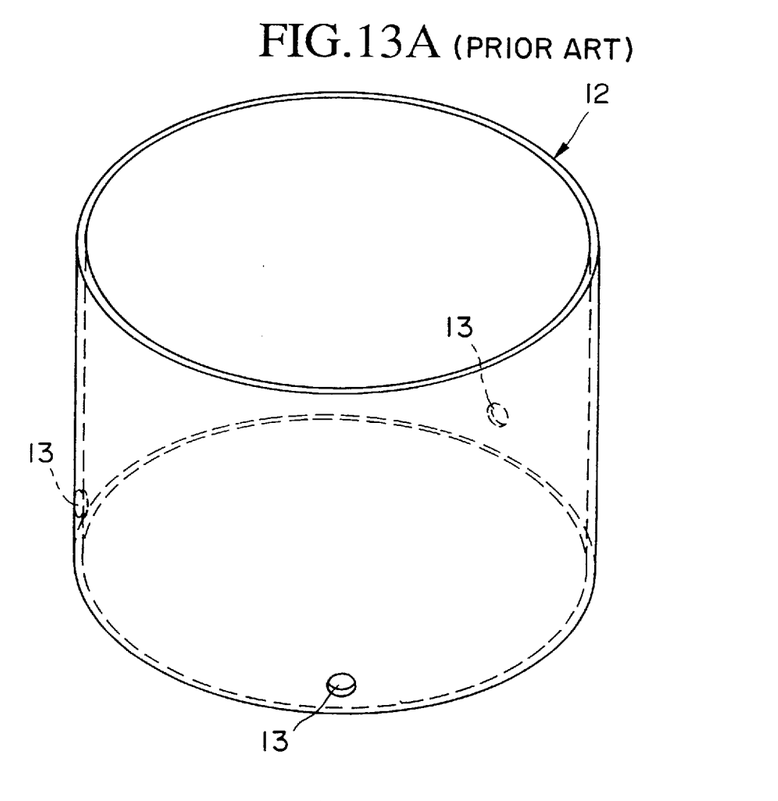
FIG. 13A and FIG. 13B (prior art) are respectively, a perspective view showing an inner crucible of the conventional single crystal pulling apparatus relevant to the present invention, and an enlarged elevation view of the essential elements.
Figure 13B:
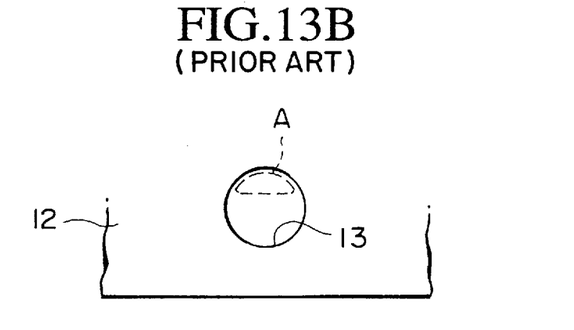

After storage of the semiconductor melt 21 in the outer crucible 11, the inner crucible 12 is mounted on to the outer crucible to form the double crucible, and there are occasions when gas bubbles A of a gas such as argon, which is being used as the inert gas atmosphere, can adhere to the multiple communicating apertures 13 of the inner crucible 12, as shown in FIG. 13B. In those communicating apertures 13 where gas bubbles A have adhered in this way, the effective diameter of the aperture is narrowed, which increases the melt flow resistance, hindering the flow of the semiconductor melt 21 from the outer crucible 11, through the communicating apertures 13, to the inner crucible 12. That is, the diameter of the communicating apertures 13 becomes narrower than the suitable diameter range described above, and single crystal growth becomes problematic.

Furthermore, if the diameters of the communicating apertures are increased, it could be expected that effects from adhered gas bubbles A would be diminished, but as described above, there is an upper limit to the diameter of these communicating apertures 13, which limits the amount by which the diameters can be increased.

DISCLOSURE OF THE INVENTION

The present invention takes the above problem into consideration, and aims to provide an apparatus which controls the adherence of gas bubbles formed during installation of the inner crucible, and allows the stable pulling of long, large diameter single crystals.

According to one configuration of the present invention, there is provided a single crystal pulling apparatus comprising an outer crucible for storing a semiconductor melt, and a cylindrical inner crucible which acts as a partition body mounted inside said outer crucible to thus form a double crucible, and said inner crucible contains a communicating portion which is formed when said double crucible is formed, for allowing flow of said semiconductor melt into said inner crucible, and said communicating portion incorporates means for removal of gas bubbles which have adhered to the communicating portion.

With this single crystal pulling apparatus, the communicating portion to which gas bubbles can adhere easily, incorporates a bubble removal arrangement, and so it is unlikely that gas bubbles will remain in the communicating portion, and stable pulling of long, large diameter single crystals is thus possible.

With this configuration a technique is adopted where the communicating portion which incorporates the bubble removal arrangement, comprises a notched portion formed on the bottom edge of the inner crucible.

With this single crystal pulling apparatus, since the communicating portion, which incorporates the bubble removal arrangement, consist not of a communicating aperture in the wall of the inner crucible, but of a notched portion, then when the bottom edge of the inner crucible comes into contact with the semiconductor melt, the semiconductor melt can immediately flow into the bottom of the notched portion, and as the inner crucible is inserted down into the semiconductor melt, the semiconductor melt will gradually infiltrate into the notched portion forcing out the air bubbles in the notched portion, and hence the adherence of gas bubbles to the notched portion is prevented.

Furthermore, the notched portion should preferably include an apex portion which gradually narrows to an apex at the top.

With this single crystal pulling apparatus, because the notched portion contains an apex portion, the width across the bottom edge of the notched portion can be set at a larger value than, for example, a simple rectangular notched portion with no apex portion, and yet the apertural area of the notched portion maintained at the same value. Consequently, because the bottom edge of the notched portion, which is the first part which comes into contact with the semiconductor melt during formation of the double crucible, can be fixed at a wide value, the semiconductor melt will infiltrate the notched portion easily, and the process of forcing out any gas bubbles adhered in the notched portion will also happen more easily.

Moreover, preferably a width across a bottom edge of the notched portion is set to a maximum possible width.

With this single crystal pulling apparatus, since the width across the bottom edge of the notched portion is set to the maximum possible width, then when the double crucible is formed, because the bottom edge of the notched portion, which is the first point into which the semiconductor melt infiltrates on contact with the melt, is as wide as possible, the semiconductor melt infiltrates easily into the notched portion, making it even easier to force out any adhered gas bubbles.

Furthermore, preferably the notched portion contains a vertical upright portion in a lower portion thereof.

Because the notched portion of a formed double crucible comes into direct contact with the outer crucible and the high temperature semiconductor melt, thermal deformation can occur quite easily. However, with this single crystal pulling apparatus, because the lower portion of the notched portion consists of an upright portion, the periphery of the notched portion has strength in terms of the vertical direction. Consequently, even if the notched portion weakens under heat, it is unlikely that deformation will occur, particularly in the vertical direction, and so the shape is maintained.

Furthermore, preferably the inner crucible has a thickened portion at least at a periphery of a lower portion of the notched portion, which is thicker than the other portions.

As described above, the notched portion of a formed double crucible is quite susceptible to thermal deformation, but with this single crystal pulling apparatus, because there is a thickened portion which is thicker than the other portions, at the periphery of the lower portion of the notched portion which is the portion proximate to the outer crucible, the thickened portion has greater strength than the remaining portions. Consequently, even if the notched portion weakens under heat, it is unlikely that deformation will occur, and so the shape is maintained.

Moreover, in order to increase the overall strength of the notched portion, it is desirable that the thickened portion be built not only into the lower portion of the notched portions, but into the whole periphery of the notched portion.

Furthermore, preferably the outer crucible has a sloped surface on the inside which slopes inwards, and the inner crucible is positioned with a bottom edge in contact with the sloped surface, and an outer peripheral surface of the bottom edge is a sloping tapered surface which slopes towards the inside of the bottom edge.

As described above, the notched portion of a formed double crucible is susceptible to heat deformation, but with this single crystal pulling apparatus, because the outer peripheral surface of the bottom edge of the inner crucible is a tapered surface, the outer peripheral surface of the bottom edge of the inner crucible contacts the sloped surface of the inner wall of the outer crucible in a full surface contact, thus supporting the inner crucible. Consequently, the dead weight which rests on the bottom edge of the inner crucible is dispersed by the full surface contact, and any heat deformation of the bottom edge is reduced, and the shape of the notched portion located on the bottom edge is maintained.

Furthermore, because the outer peripheral surface of the bottom edge of the inner crucible comes into full surface contact with the inner surface of the outer crucible, adhesion with the outer crucible is improved. Consequently even if, for example, during the mounting of the inner crucible, a shift in position occurs, it is unlikely that a gap will develop between the bottom edge of the inner crucible and the outer crucible.

With the embodiment above, the outer crucible has a sloped surface on the inner surface which slopes inwards, and the inner crucible has a communicating aperture in a side wall serving as the communicating portion, for allowing flow of the semiconductor melt into the inside of the inner crucible when the double crucible is formed, and the communicating aperture employs as the bubble removal arrangement, a tapered portion, at least on an upper edge portion of the aperture, where the thickness gradually tapers down.

With this single crystal pulling apparatus, because the upper edge portion of the communicating aperture consists of a tapered portion, which acts as a bubble removal arrangement when the double crucible is formed and the inner crucible is immersed in the semiconductor melt, the adherence of gas bubbles in the communicating aperture is prevented, because the semiconductor melt infiltrates the communicating aperture forcing out any adhered gas bubbles, and the action of the upper tapered portion guides any bubbles out.

Furthermore, because the width of the leading edge of the upper edge portion of the communicating aperture is narrow, the contact surface area between the gas bubble and the leading edge of the entire communicating aperture reduces, which contributes to the simple removal of gas bubbles as the semiconductor melt infiltrates into the aperture.

Furthermore, with the embodiment above, the inner crucible contains a notched portion which forms the communicating portion at the bottom edge of the inner crucible when the double crucible is formed, and which allows the semiconductor melt to flow into the inside of the inner crucible, and the notched portion, at least on an upper edge portion thereof, has a tapered portion where the thickness gradually tapers down.

With this single crystal pulling apparatus the upper edge portion of the notched portion consists of a tapered portion, and so when the bottom edge of the inner crucible comes into contact with the semiconductor melt, the semiconductor melt can immediately flow into the bottom of the notched portion, and the semiconductor melt gradually infiltrates into the notched portion, forcing any gas bubbles upwards. At this point, because the gas bubbles are guided out by the tapered upper portion of the notched portion, the adherence of gas bubbles to the notched portion is prevented.

Furthermore, because the width of the leading edge of the upper edge portion of the notched portion narrows, and the contact surface area between the leading edge of the upper portion and the gas bubble decreases, the removal of gas bubbles during the infiltration of the notched portion by the semiconductor melt is facilitated.

Once the double crucible has been formed by mounting the inner crucible inside the outer crucible, the notched portion forms a communicating portion, allowing flow of the semiconductor melt into the inside of the inner crucible.

Furthermore, it is preferable if the upper edge portion contains a sloped surface, which slopes inwards towards the communicating aperture or notched portion from the external surface of the inner crucible to the internal surface.

With this single crystal pulling apparatus, because the upper edge portion of the communicating aperture or notched portion contains a sloped surface which slopes downwards from the external surface of the inner crucible to the internal surface, when the double crucible is formed, any gas bubbles are pushed up by the semiconductor melt, and guided out of the inner crucible by the sloped surface. Consequently, the flow of the gas bubbles into the inside of the inner crucible, which is the crystal growing region, is suppressed.

DESCRIPTION OF THE PREFERRED EMBODIMENTS

A description of a first embodiment of the present invention is given below, with reference to FIGS. 1 and 2. In these figures, numeral 31 refers to a silicon single crystal pulling apparatus, numeral 32 to a notched portion, and numeral 33 to an inner crucible.

Figure 1:
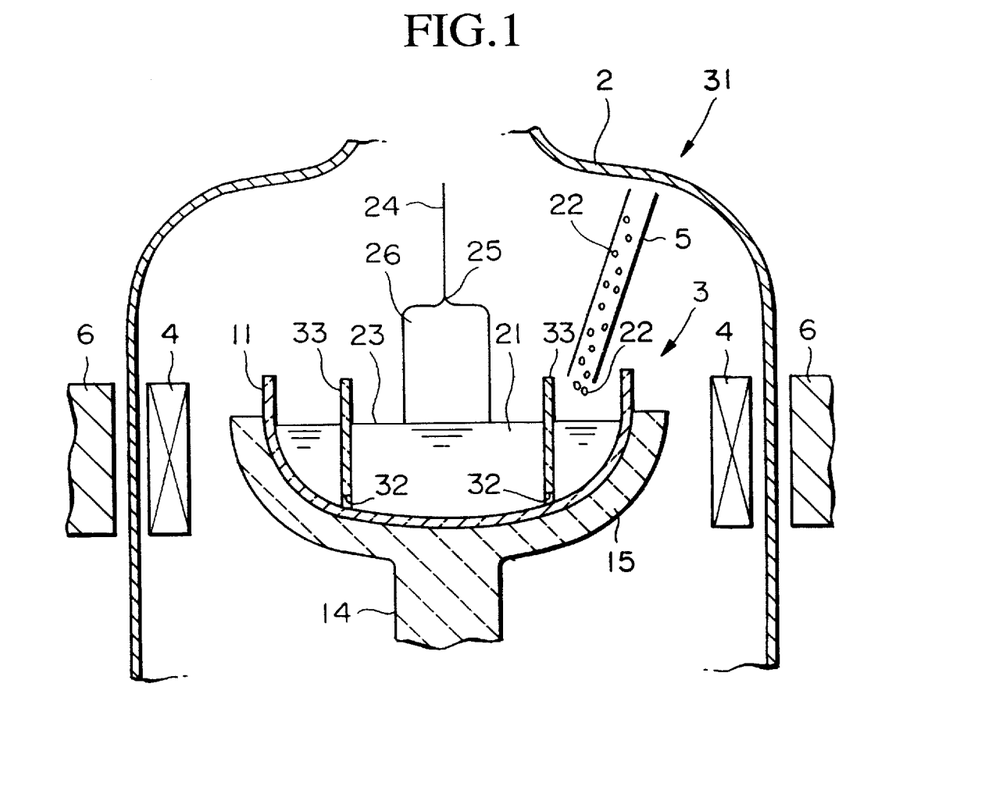
FIG. 1 is a cross-sectional view of a first embodiment of a single crystal pulling apparatus of the present invention.

With the single crystal pulling apparatus 31 of the first embodiment, the inner crucible 12 of the previously explained, currently employed, example single crystal pulling apparatus 1, which contains communicating apertures 13, is substituted with an inner crucible 33 which contains notched portions 32, as shown in FIG. 1, while those configuration elements which are the same in FIG. 1 as those in FIG. 12 are given the same numeral, and their description is omitted.

Figure 2A:
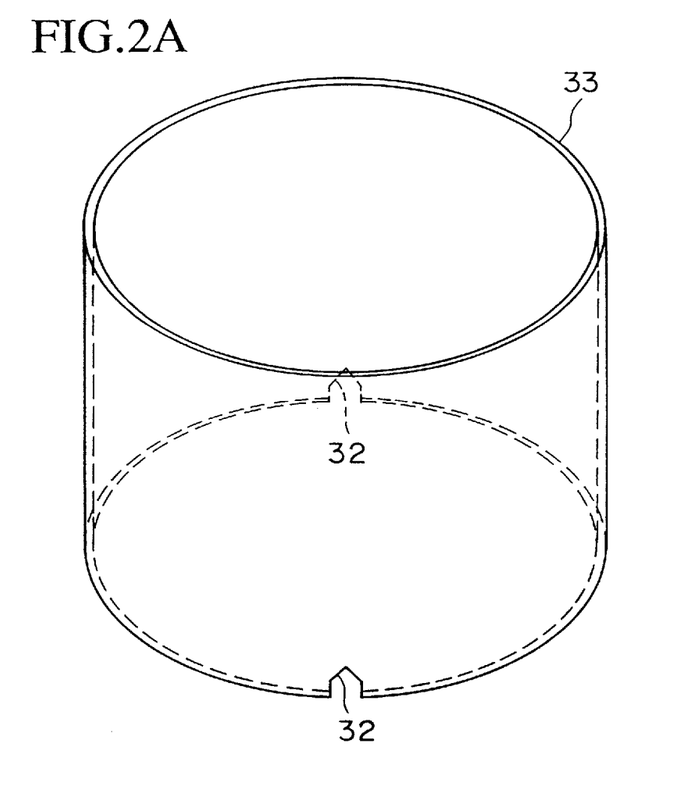
FIG. 2A and FIG. 2B are respectively, a perspective view of an inner crucible of the first embodiment of the single crystal pulling apparatus of the present invention, and an enlarged elevation view of the essential elements of the inner crucible.

The single crystal pulling apparatus 31 employs a double crucible construction, in which an inner crucible 33 which consists of a cylindrical partition body made of quartz as shown in FIG. 2A, is mounted inside an outer crucible 11 in which a semiconductor melt 21 is stored.

The inner crucible 33 contains two notched portions 32 on the bottom edge of the crucible, which are located on opposite sides of the crucible with respect to the axis. The notched portions 32 constitute the communicating portions which allow the semiconductor melt 21 to flow from outside the inner crucible 33 to the inside thereof, when the double crucible is formed.

Figure 2B:
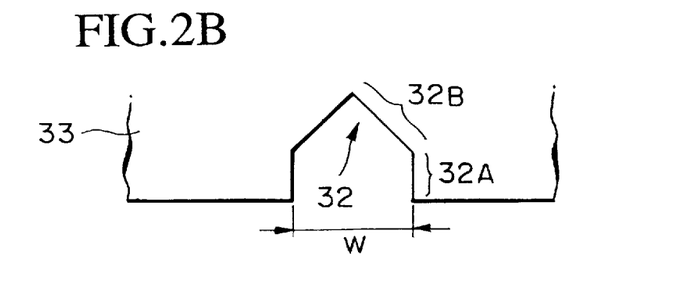

The notched portions 32 contain an upright portion 32A in the bottom portion of the notched portion which is perpendicularly upright, and an apex portion 32B in the top portion of the notched portion, in which the width gradually narrows to a 90° apex at the top, as shown in FIG. 2B.

Furthermore, the width W across the bottom edge of the notched portions 32 is set to the maximum value.

The width W across the bottom edge of the notched portions 32 is set to a width of 5 mm or greater. If the bottom edge width W is less than 5 mm, it becomes difficult for the semiconductor melt 21 to flow from the outer crucible 11 to inside the inner crucible 33, and a difference in the melt levels inside and outside the inner crucible 33 develops.

Furthermore, taking into consideration phenomena such as reverse flow of the semiconductor 21 from inside the inner crucible 33 back out to the outer crucible 11, then particularly suitable values for the bottom edge width W are $0.050 < W/\emptyset < 0.055$, where $\emptyset$ is the internal diameter of the inner crucible 33.

Furthermore, the total apertural area S of all notched portions 32 is set to a value in the range $W^2/2 \leq S \leq 2W^2$. If the value is less than the lower limit of this range, then the flow of semiconductor melt 21 from the notched portions is insufficient to maintain the single crystal growth, and a problematic difference in the melt levels inside and outside the inner crucible 33 develops.

Consequently, the number of notched portions 32, and the apertural area of a single notched portion 32, are decided by the values which are set for the total apertural area S, and the bottom edge width W.

Next is a description of the method employed in using the first embodiment of the single crystal pulling apparatus of the present invention for growing single crystals of semiconductors such as silicon.

INITIAL SOURCE MATERIAL MELT PROCESS

First, a predetermined volume of polycrystalline source material such as polysilicon is placed in the outer crucible 11, and the chamber 2 evacuated with a vacuum pump, or the like, to produce a vacuum. Next, an inert gas such as argon (Ar) is introduced into the chamber 2, and while the outer crucible 11 is rotated at a predetermined angular velocity by rotating the shaft 14 in a horizontal plane about its axis at a predetermined angular velocity, the heater 4 is activated, and the polycrystalline source material inside the double crucible 11 heated to a temperature exceeding the single crystal growing temperature to melt the source material completely.

DOUBLE CRUCIBLE FORMATION PROCESS

After the source material has melted completely, the heat being applied by the heater 4 is reduced slightly, and the inner crucible 33 is lowered into the semiconductor melt 21 and mounted onto the outer crucible 11 concentric therewith, forming the double crucible.

At this stage, because the inner crucible 33 does not contain communicating apertures, but the notched portions 32, as soon as the bottom edge of the inner crucible 33 contacts the semiconductor melt 21, the semiconductor melt 21 immediately flows inside the lower portion of the notched portions 32, and gradually the semiconductor melt 21 infiltrates right into the notched portions 32, forcing out any gas bubbles, and thus preventing the adherence of gas bubbles to the notched portions 32. Furthermore, when the inner crucible 33 is mounted on the outer crucible 11 to form the double crucible, the notched portions 32 form the communicating portions which allow the semiconductor melt 21 to flow into the inner crucible.

Furthermore, because each notched portion 32 includes an apex portion 32B, the bottom edge width W can be set to a larger value than, for example, a simple rectangular notched portion which contains no apex portion, and yet the apertural area of the notched portion maintained at the same constant value. That is, because the width of the lower portion of each notched portion 32, which is the portion which first contacts the semiconductor melt 21, is set to a large value, it is easy for the semiconductor melt 21 to infiltrate into the notched portions 32, making it easier to force out any adhered gas bubbles.

Moreover, because the width W across the bottom edge of the notched portions 32 is set to the maximum value, the lower portion of each notched portion 32, which is the portion which first contacts the semiconductor melt 21, is of maximum width, making the removal of any adhered gas bubbles even easier.

SINGLE CRYSTAL GROWING PROCESS

Following formation of the double crucible, an electric current is passed through the magnet 6, applying a magnetic field of predetermined strength, the electrical power to the heater 4 is adjusted so as to maintain the surface temperature in the periphery of the middle area 23 of the semiconductor melt 21 at the single crystal growing temperature, and after the seed crystal 25, which is suspended from the pulling shaft 24, is contacted with the semiconductor melt 21, a single crystal of semiconductor 26 is grown around the nucleus of the seed crystal 25. Thus, following preparation of a seed crystal which is free of dislocation, the diameter of the single crystal is gradually increased to produce a single crystal of semiconductor 26 of specified diameter.

In this crystal growth process, the source material 22, consisting of granules of silicon, is added continuously to the system in an amount proportional to the growth rate (pull rate) of the single crystal of semiconductor 26 (dopants are also added as necessary), and this added source material 22 melts in the outer crucible 11, outside the inner crucible 33, and passes through the notched portions 32, which constitute the communicating portions, and is thus supplied continuously to the inside of the inner crucible 33. The above method can be used to grow single crystals of semiconductor 26.

In the above double crucible configuration, the lower portion of the notched portions 32 consists of an upright portion 32A, and so even though the influence of the heat when the notched portions come in direct contact with the high temperature outer crucible 11 is large, because the notched portions have great strength in the vertical direction, even if they weaken under the heat, it is unlikely that deformation will occur in the vertical direction, and so their shape is maintained.

Figure 3:
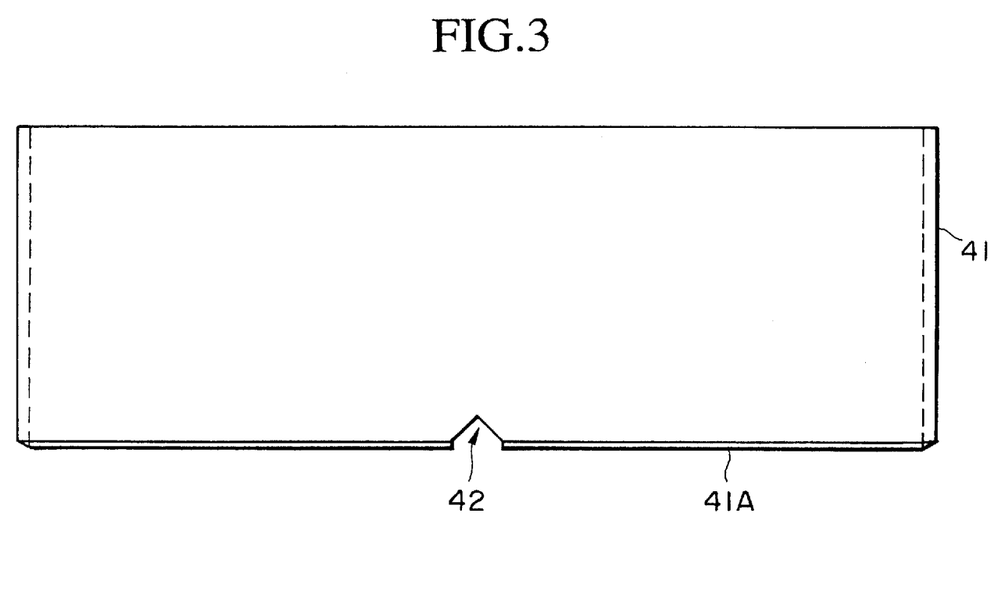
FIG. 3 is a elevation view of the inner crucible of a second embodiment of the single crystal pulling apparatus of the present invention.
Figure 4:
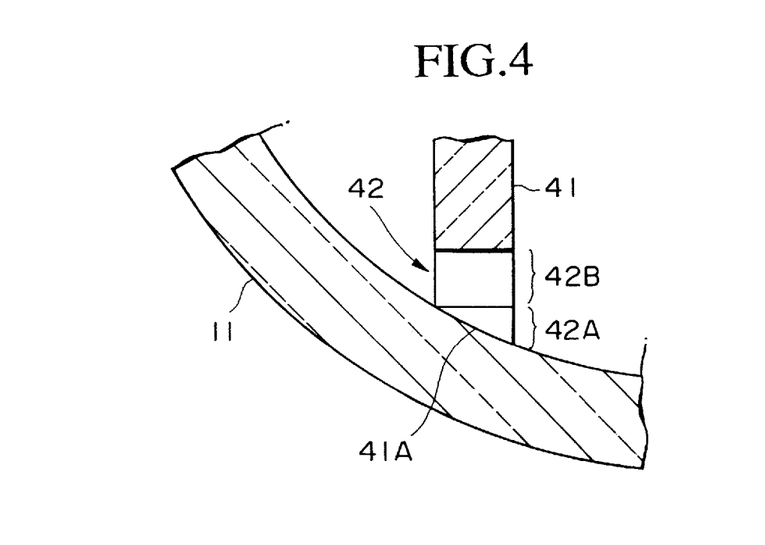
FIG. 4 is an enlarged cross-sectional view showing the essential elements of the outer crucible and inner crucible of the second embodiment of the single crystal pulling apparatus of the present invention.

Next is a description of a second embodiment of the present invention with reference to FIGS. 3 and 4. In these figures numeral 41 represents an inner crucible, and numeral 42 a notched portion.

The point where the second embodiment and the first embodiment differ, is that the external surface 41A of the bottom edge of the inner crucible 41 in the second embodiment, consists of a tapered surface which slopes down towards the inside edge. That is, the inner crucible 41 is positioned so that the bottom edge contacts the sloped surface on the inside of the outer crucible 11, and the external surface 41A of the bottom edge, which consists of a tapered surface which matches the sloped surface, comes into full surface contact with the sloped surface, thus supporting the inner crucible 41. Consequently, the dead weight which rests on the bottom edge of the inner crucible 41 is dispersed by the full surface contact, and any heat deformation of the bottom edge is reduced, and the shape of the notched portions 42 located on the bottom edge can be maintained. Moreover, the notched portions 42, like the notched portions 32 of the first embodiment, contain an upright portion 42A and an apex portion 42B, with the perimeter of the upright portion consisting of a tapered surface.

Furthermore, because the external surface 41A of the bottom edge of the inner crucible 41 comes into full surface contact with the inner surface of the outer crucible 11, the adhesion with the outer crucible 11 is improved. Consequently even if, for example, during the mounting of the inner crucible 41, a shift in position occurs, it is unlikely that a gap will develop between the bottom edge of the inner crucible 41 and the outer crucible 11.

Figure 5:
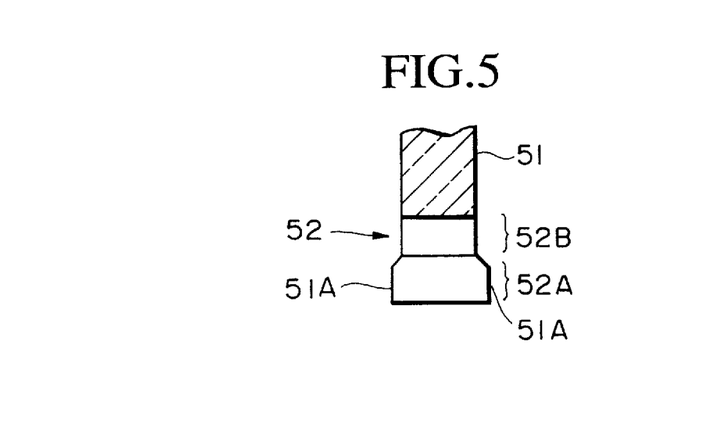
FIG. 5 is an enlarged cross-sectional view showing the essential elements of an inner crucible of a third embodiment of the single crystal pulling apparatus of the present invention.

Next is a description of a third embodiment of the present invention with reference to FIG. 5. In this figure, numeral 51 refers to an inner crucible, and numeral 52 to a notched portion.

The point where the third embodiment and the first embodiment differ, is that in the inner crucible 51 of the third embodiment, the periphery of the lower portion of the notched portions 52 consists of a thickened portion 51A, in which the crucible wall is thicker than in the other portions. That is, the periphery of the lower portion of the notched portions 52, which is proximate to the outer crucible 11, consists of the thickened portion 51A, and the thickened portion 51A has greater strength than the remaining portion. Consequently, even if the notched portions 52 weaken under heat, it is unlikely that deformation will occur, and so their shape is maintained. Furthermore, the notched portions 52, like the notched portions 32 of the first embodiment, consist of an upright portion 52A and an apex portion 52B, and the periphery of the upright portion 52A corresponds to the thickened portion 51A.

Next is a description of a fourth embodiment of the present invention with reference to FIGS. 6 to 8A, 8B.

In these figures, numeral 131 refers to a silicon single crystal pulling apparatus, numeral 132 to a communicating aperture, and numeral 133 to an inner crucible.

Figure 6:
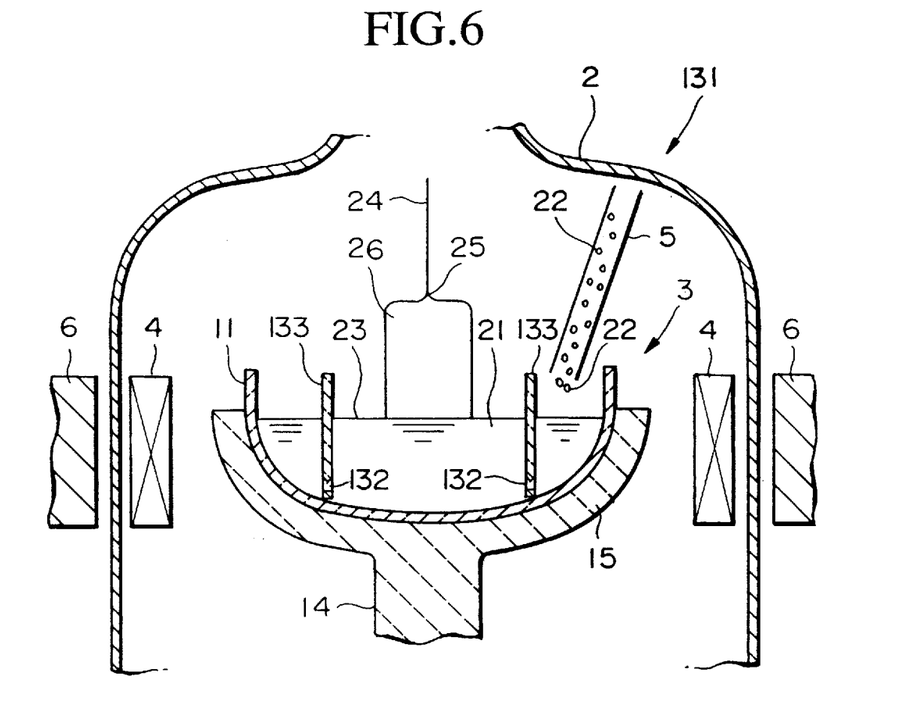
FIG. 6 is a cross-sectional view showing a fourth embodiment of the single crystal pulling apparatus of the present invention.

With the single crystal pulling apparatus 131 of the fourth embodiment, the inner crucible 12 of the previously explained, currently employed, example single crystal pulling apparatus 1, which contains communicating apertures 13, is substituted with an inner crucible 133 which contains communicating apertures 132 of a different shape to the communicating apertures 13, as shown in FIG. 6, while those configuration elements which are the same in FIG. 6 as those in FIG. 12 are given the same numeral, and their description is omitted.

Figure 7:
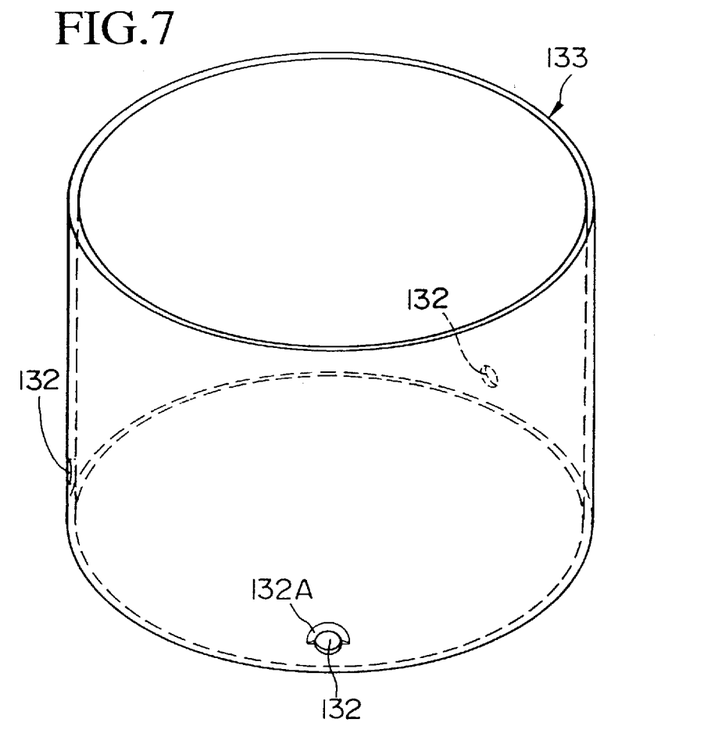
FIG. 7 is a perspective view showing an inner crucible of the fourth embodiment of the single crystal pulling apparatus of the present invention.

The single crystal pulling apparatus 131 employs a double crucible construction, in which an inner crucible 133 which consists of a cylindrical partition body made of quartz as shown in FIG. 7, is mounted inside an outer crucible 11 in which a semiconductor melt 21 is stored.

Figure 8A:
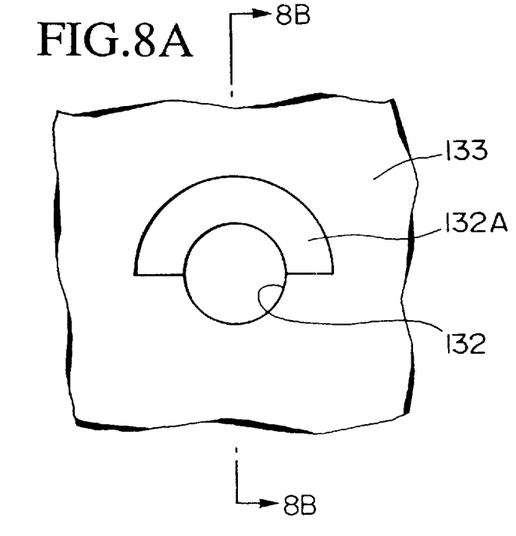
FIG. 8A and FIG. 8B are respectively, an enlarged elevation view showing the essential elements of the inner crucible of the fourth embodiment of the single crystal pulling apparatus of the present invention, and a cross-sectional view along the line 8B—8B shown in the elevation view in FIG. 8A.
Figure 8B:
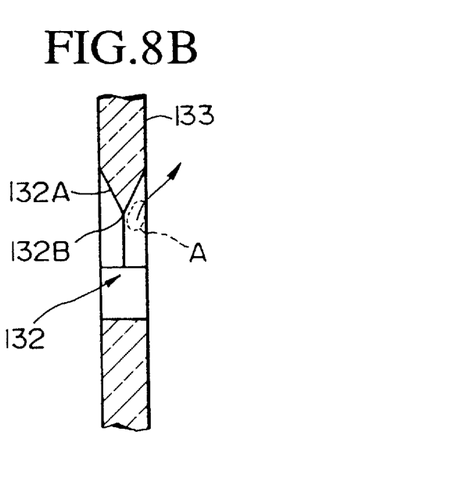

The inner crucible 133 contains three communicating apertures 132 in the lower portion of the side wall of the crucible, which are located equidistant from one another and centered around the axis. With these communicating apertures 132, an upper edge portion 132A in the upper half of the aperture consists of a tapered portion where the crucible wall gradually narrows down towards the inside of the aperture 132, while the minimal opening is circular in shape.

The upper edge portion 132A is a tapered portion in which both the inside and outside surfaces of the inner crucible 133 are sloped, and a leading edge 132B of that tapered portion is located inside the communicating aperture 132.

Furthermore, the aperture diameter of the communicating apertures 132 is set within a range which ensures that a difference in melt levels between the inside and outside of the inner crucible 133 does not develop, and a reverse flow phenomenon where the semiconductor melt 21 flows back from inside the inner crucible 133 to outside the inner crucible 133 does not occur.

Next is a description of the double crucible formation process which occurs in the method for growing single silicon semiconductor crystals using the fourth embodiment of the single crystal pulling apparatus of the present invention. The initial source material melting process and the single crystal growing process are the same as those described in the first embodiment above.

DOUBLE CRUCIBLE FORMATION PROCESS

After the source material has melted completely, the heat being applied by the heater 4 is reduced slightly, and the inner crucible 133 is lowered into the semiconductor melt 21 and mounted onto the outer crucible 11 concentric therewith, forming the double crucible.

At this stage, because the upper edge portion 132A of each of the communicating apertures 132 consists of a tapered portion, when the inner crucible 133 is lowered into the semiconductor melt 21, the adherence of gas bubbles A in the communicating apertures 132 is prevented, because the semiconductor melt 21 will infiltrate the communicating portions 132, forcing any adhered gas bubbles A upwards, and the upper edge portions 132A, consisting of tapered portions, will then guide the gas bubbles out towards either the inside or the outside of the inner crucible.

Furthermore, because the width of the leading edge 132B of the upper edge portion 132A of the communicating apertures 132 narrows, the contact surface area between the gas bubble A and the leading edge reduces, which contributes to the simple removal of gas bubbles A as the semiconductor melt 21 infiltrates into the aperture.

Furthermore, in the crystal growing process, following the formation of the double crucible, the source material 22, consisting of granules of silicon, is added continuously to the system in an amount proportional to the growth rate (pull rate) of the single crystal of semiconductor 26 (dopants are also added as necessary), and this added source material 22 melts in the outer crucible 11, outside the inner crucible 133, passes through the communicating apertures 132, and is supplied continuously to the inside of the inner crucible 133.

Figure 9A:
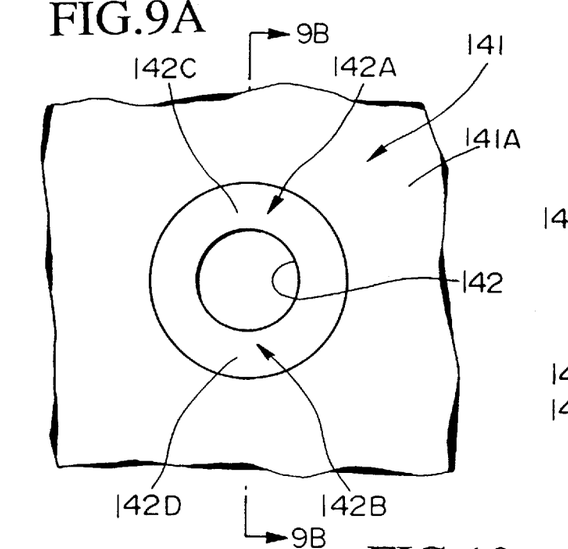
FIG. 9A and FIG. 9B are respectively, an enlarged elevation view showing the essential elements of an inner crucible of a fifth embodiment of the single crystal pulling apparatus of the present invention, and a cross-sectional view along the line 9B—9B shown in the elevation view in FIG. 9A.
Figure 9B:
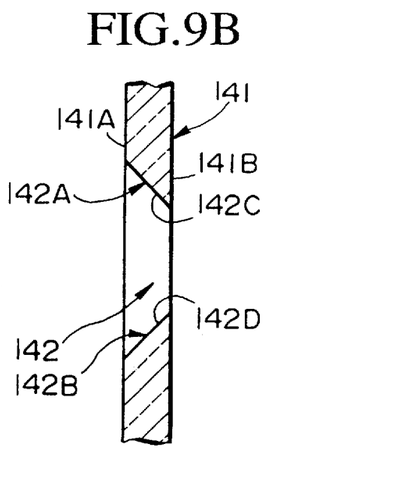

Next is a description of a fifth embodiment of the present invention, with reference to FIGS. 9A and 9B. In these figures numeral 141 refers to an inner crucible, and numeral 142 to a communicating aperture.

The point where the fifth embodiment and the fourth embodiment differ, is that the surrounding edge portion of each communicating aperture 142 in the inner crucible 141 of the fifth embodiment, consists of an upper edge portion 142A and a lower edge portion 142B, both of which are tapered portions where the crucible wall gradually narrows down towards the inside of the communicating aperture 142.

Furthermore, the upper edge portion 142A consists of a sloped surface 142C which slopes inwards towards the communicating aperture 142, from the external surface 141A of the inner crucible 141 to the internal surface 141B, and the lower edge portion 142B consists of a sloped surface 142D which slopes inwards towards the communicating aperture 142, from the external surface 141A of the inner crucible 141 to the internal surface 141B.

That is, when the double crucible is formed, any gas bubbles in the communicating apertures 142 are pushed up with the flow of the semiconductor melt 21, guided by the sloped surface 142C of the upper edge portion 142A, and then forced outside the inner crucible 141. Consequently, the flow of gas bubbles into the inside of the inner crucible 141, which is the crystal growing region, can be suppressed.

Furthermore, because not only the upper edge portion 142A of each communicating aperture 142, but also the lower edge portion 142B is tapered, the width of the leading edge of the surrounding edge portion narrows, and the contact surface area between the gas bubbles and the leading edge is greatly reduced, which contributes further to the simple removal of gas bubbles as the semiconductor melt 21 infiltrates into the communicating apertures.

Figure 10:
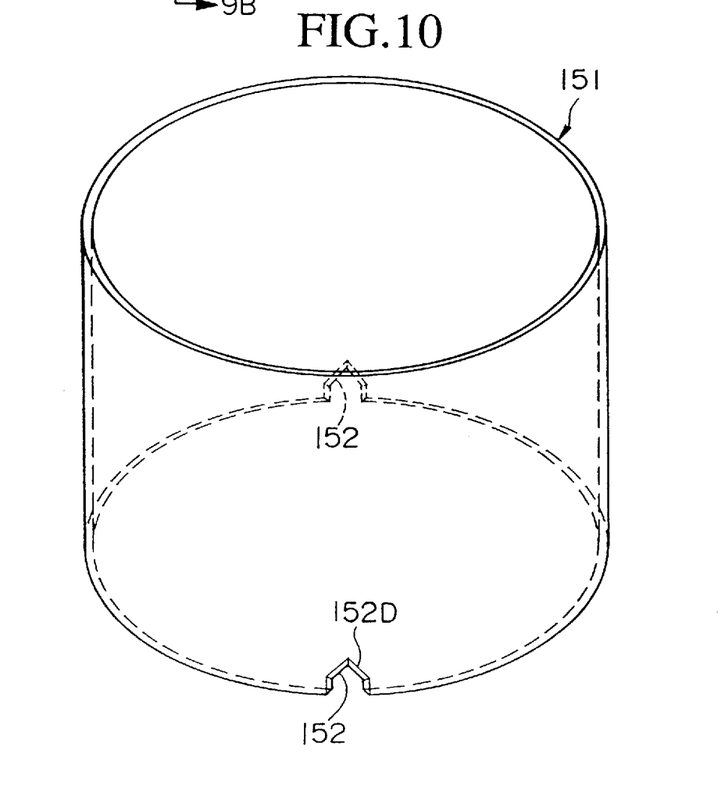
FIG. 10 is a perspective view showing an inner crucible of a sixth embodiment of the single crystal pulling apparatus of the present invention.
Figure 11A:
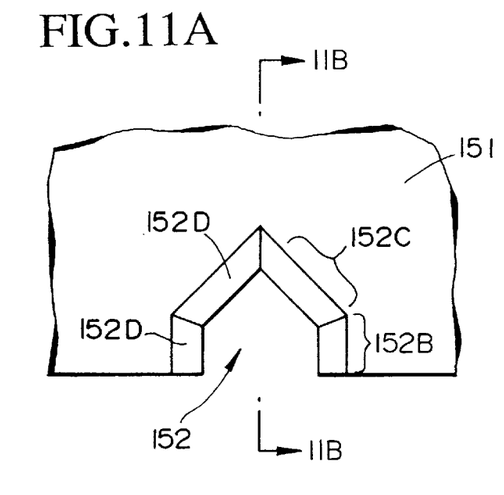
FIG. 11A and FIG. 11B are respectively, an enlarged elevation view showing the essential elements of the inner crucible of the sixth embodiment of the single crystal pulling apparatus of the present invention, and a cross-sectional view along the line 11B—11B shown in the elevation view in FIG. 11A.
Figure 11B:
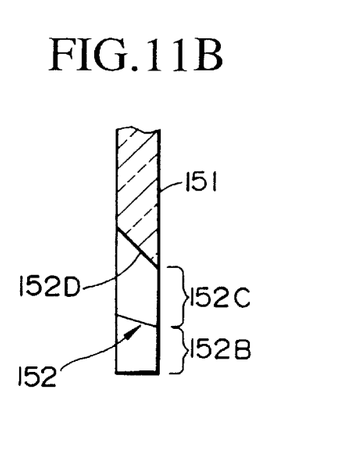

Next is an description of a sixth embodiment of the present invention, with reference to FIGS. 10, 11A and 11B.

In these figures, numeral 151 refers to an inner crucible, and numeral 152 to a notched portion. The point where the sixth embodiment and the fifth embodiment differ, is that the communicating portions in the inner crucible 151, which allow the semiconductor melt 21 to flow inside the crucible, consist not of communicating apertures, but of notched portions 152. That is, the inner crucible 151 contains two notched portions 152 on the bottom edge of the crucible, which are located on opposite sides of the crucible with respect to the axis, and these notched portions 152 constitute the communicating portions which allow the semiconductor melt 21 to flow inside the inner crucible when the double crucible is formed.

The notched portions 152 contain an upright portion 152B in the bottom portion of the notched portion which is perpendicularly upright, and an apex portion 152C in the top portion of the notched portion, in which the width gradually narrows to a 90° apex at the top, as shown in FIG. 11A.

The surrounding edge 152D of the upright portion 152B and apex portion 152C consists of a tapered portion which gradually narrows down towards the inside of the notched portion 152.

Consequently, because the surrounding edge portion 152D of each of these communicating portions 152 consists of a tapered portion, when the bottom edge of the inner crucible 151 comes into contact with the semiconductor melt 21, the semiconductor melt 21 can immediately flow into the bottom portion of the notched portions 152, and the semiconductor melt 21 gradually infiltrates into the notched portions 152, forcing any gas bubbles upwards. At this point, because the gas bubbles are guided outside of the inner crucible 151 by the tapered surrounding edge portion 152D of the notched portion, the adherence of gas bubbles to the notched portions 152 is prevented.

Furthermore, the minimal apertural diameter of the notched portions 152 when the inner crucible 151 is mounted inside the outer crucible 11, is set within a range which ensures that a difference in melt levels between the inside and outside of the inner crucible 151 does not develop, and that a reverse flow phenomenon where the semiconductor melt 21 flows back from inside the inner crucible 151 to outside the inner crucible 151 does not occur.

Furthermore, the present invention also includes the following types of embodiments.

(1) The inner crucibles 33, 41, 51, 133, 141 and 151 are cylindrical partition bodies, but shapes other than cylinders are also possible. For example, a partition body which consists of a closed cylinder, with a bottom face, may also be used.

(2) The upper portions of the notched portions 32, 42, and 52 each consist of a 90° apex portion, 32B, 42B and 52B respectively, but apex portions of different shapes are also possible. For example, notched portions where the upper portion consists of a circular arc shaped section may also be used.

(3) The inner crucibles 33, 41 and 51 each contain two notched portions, 32, 42 and 52 respectively, but crucibles with a single notched portion, or with more than two notched portions, are also possible. Furthermore, the inner crucibles 133 and 141 each contain 3 communicating apertures, 132 and 142 respectively, and the inner crucible 151 contains 2 notched portions, but crucibles with either a single communicating aperture 132, 142, or single notched portion 152, or alternatively with a greater number than those listed above are also possible. In particular, if the diameter of the crucible is increased to allow the growing of larger diameter single crystals, it is desirable to have multiple communicating apertures or notched portions in the inner crucible.

(4) The single crystal pulling apparatus described above employed the continuous magnetic field applied CZ technique (CMCZ technique), but provided the apparatus employs a double crucible construction, other single crystal production methods may also be used. For example, the continuous charge CZ growth technique (CCZ technique), which does not involve magnetic field application, may be used.

(5) In the third embodiment the inner crucible 51 contains a thickened protruding portion 51A on both the internal and external surfaces, but an inner crucible with a thickened protruding portion on either one of the internal or external surface is also possible. Moreover, in order to increase the overall strength of the notched portions 52, it is desirable that the thickened portion be built into not only the lower portion of the notched portions, but into the whole periphery of the notched portions.

(6) The upper edge portions 132A of the communicating apertures 132, the surrounding edge portions 142A of the communicating apertures 142, and the surrounding edge portions 152D of the notched portions 152 all consist of tapered portions which appear triangular in shape in their respective sectional profiles, but tapered sections which appear as trapezoids in a sectional profile are also possible.

The present invention produces the following effects.

With the first embodiment of the present invention, the communicating portions, to which gas bubbles can adhere easily, incorporate a bubble removal arrangement, and so it is unlikely that gas bubbles will remain in the communicating portions, and hence stable pulling of long, large diameter single crystals is possible.

With this embodiment, because the communicating portions, which incorporate a bubble removal arrangement, comprise notched portions on the bottom edge of the inner crucible, when the double crucible is formed, the semiconductor melt pushes any gas bubbles out of the notched portions, thus preventing adherence of gas bubbles to the notched portions, and allowing suppression of any increase in the flow resistance the semiconductor melt meets as it flows through the notched portions. Consequently, the actual apertural area of the communicating portions remains at the set value, allowing favorable single crystal growth.

With this embodiment, by including an apex portion in the notched portions, it is possible to set the width across the bottom edge of each notched portion to a larger value than, for example, a simple rectangular notched portion with no apex portion, and so when the double crucible is formed, the semiconductor melt infiltrates easily into the notched portions, making it easier to force out any adhered gas bubbles.

Furthermore, if the width across the bottom edge of the notched portions is set to the maximum possible width, when the double crucible is formed, the semiconductor melt infiltrates easily into the notched portions, making it even easier to force out any adhered gas bubbles.

Moreover, if the lower portion of the notched portions consists of an upright portion, then the periphery of the lower portion of the notched portions has increased strength in terms of the vertical direction, and even if the notched portions weaken under heat, it is unlikely that deformation will occur, and so their shape can be maintained. Consequently, it is possible to suppress variations in the apertural area of the communicating portions caused by heat deformation of the notched portions.

Moreover, by including a thickened portion, which is thicker than the other portions, in the inner crucible wall in the periphery of the lower portion of the notched portions, which is the portion proximate to the outer crucible, the strength of the thickened portion is greater than the remaining portion, and even if the notched portions weaken under heat, it is unlikely that deformation will occur, and so the shape of the notched portions is maintained. Consequently, it is possible to suppress variations in the apertural area of the communicating portions caused by heat deformation of the notched portions.

Furthermore, if the outer peripheral surface of the bottom edge of the inner crucible consists of a tapered surface, the outer peripheral surface of the bottom edge of the inner crucible contacts the sloped surface on the inner wall of the outer crucible in a full surface contact, thus supporting the inner crucible, and so any heat deformation of the bottom edge is reduced, and the shape of the notched portions located on the bottom edge are maintained.

Moreover, because the outer peripheral surface of the bottom edge of the inner crucible comes into full surface contact with the internal surface of the outer crucible, the adhesion with the outer crucible is improved, and even if, for example, during the mounting of the inner crucible, a shift in position occurs, it is unlikely that a gap will develop between the bottom edge of the inner crucible and the outer crucible, and so it is possible to suppress any increases in the apertural area of the communicating portions caused by such gaps.

In the other embodiments of the present invention, because the upper edge portion of the communicating apertures consists of a tapered portion which acts as a bubble removal arrangement, then when the double crucible is formed, because the semiconductor melt infiltrates the communicating apertures forcing out any adhered gas bubbles, and the action of the upper tapered portion guides any bubbles out, it is possible to suppress the adherence of gas bubbles to the communicating apertures.

Furthermore, because the width of the leading edge of the upper edge portion of each communicating aperture narrows, the contact surface area between the gas bubble and the leading edge of the upper portion reduces, which contributes to the simple removal of gas bubbles.

Consequently, any gas bubbles are easily removed from the communicating apertures, and so it is possible to suppress any increase in the flow resistance the semiconductor melt meets as it flows through the communicating apertures, and the actual apertural area of the communicating portions remains at the set value, allowing favorable single crystal growth.

In these embodiments, if the upper edge portion of the notched portions consists of a tapered portion, then when the double crucible is formed, because the semiconductor melt gradually infiltrates the notched portions and forces out any adhered gas bubbles, and the action of the upper tapered portion guides any bubbles out, it is possible to suppress the adherence of gas bubbles to the notched portions.

Furthermore, because the width of the leading edge of the upper edge portion of each notched portion narrows, the contact surface area between the gas bubble and the leading edge of the upper portion reduces, which contributes to the simple removal of gas bubbles.

Consequently, any gas bubbles are easily removed from the notched portions, and so it is possible to suppress any increase in the flow resistance the semiconductor melt meets as it flows through the notched portions, and the actual apertural area of the notched portions when the double crucible is formed, remains at the set value, allowing more favorable single crystal growth.

Furthermore, if the upper edge portions consist of sloped surfaces, which slope inwards towards the communicating aperture or notched portion from the external surface of the inner crucible to the internal surface, then when the double crucible is formed, any gas bubbles can be guided by these sloped surfaces and forced out, outside of the inner crucible. Consequently, the flow of the gas bubbles into the inside of the inner crucible, which is the crystal growing region, is suppressed, and the effect such gas bubbles have on the crystal growth can be reduced.

Finally, the present application claims the priorities of Japanese Patent Applications Nos. Hei-7-341699 and Hei-7-341703 filed Dec. 27, 1995, which are herein incorporated by reference.

What is claimed is:

1. A single crystal pulling apparatus comprising:

an outer crucible for storing a semiconductor melt, and a cylindrical inner crucible which acts as a partition body mounted inside said outer crucible to thus form a double crucible, and said inner crucible contains a communicating portion which is formed when said double crucible is formed, for allowing flow of said semiconductor melt into said inner crucible, and said communicating portion incorporates means for removal of gas bubbles which have adhered to the communicating portion.

2. A single crystal pulling apparatus according to claim 1, wherein said communicating portion which incorporates said bubble removal means, comprises a notched portion formed on a bottom edge of said inner crucible.

3. A single crystal pulling apparatus according to claim 2, wherein said notched portion includes an apex portion which gradually narrows to an apex at the top.

4. A single crystal pulling apparatus according to claim 3, wherein said notched portion has a maximum width at said bottom edge of said inner crucible.

5. A single crystal pulling apparatus according to claim 4, wherein said inner crucible has a thick portion at a lower portion around said notched portion, and wherein said thick portion is thicker than the other portions.

6. A single crystal pulling apparatus according to claim 4, wherein a periphery of a lower portion of said notched portion comprises a thickened portion in said inner crucible that is thicker than other portions of the inner crucible.

7. A single crystal pulling apparatus according to claim 3, wherein said notched portion contains a vertical upright portion in a lower portion thereof.

8. A single crystal pulling apparatus according to claim 3, wherein said inner crucible has a thick portion at a lower portion around said notched portion, and wherein said thick portion is thicker than the other portions.

9. A single crystal pulling apparatus according to claim 3, wherein said outer crucible has a sloped surface on the inside which slopes inwards, and said inner crucible is positioned with a bottom edge in contact with said sloped surface, and an outer peripheral surface of said bottom edge is a sloping tapered surface which slopes towards the inside of said bottom edge.

10. A single crystal pulling apparatus according to claim 3, wherein said notched portion has a maximum width at its base.

11. A single crystal pulling apparatus according to claim 3, wherein a periphery of a lower portion of said notched portion comprises a thickened portion in said inner crucible that is thicker than other portions of the inner crucible.

12. A single crystal pulling apparatus according to claim 2, wherein said notched portion has a maximum width at said bottom edge of said inner crucible.

13. A single crystal pulling apparatus according to claim 12, wherein said notched portion contains a vertical upright portion in a lower portion thereof.

14. A single crystal pulling apparatus according to claim 12, wherein said inner crucible has a thick portion at a lower portion around said notched portion, and wherein said thick portion is thicker than the other portions.

15. A single crystal pulling apparatus according to claim 4, wherein said outer crucible has a sloped surface on the inside which slopes inwards, and said inner crucible is positioned with a bottom edge in contact with said sloped surface, and an outer peripheral surface of said bottom edge is a sloping tapered surface which slopes towards the inside of said bottom edge.

16. A single crystal pulling apparatus according to claim 12, wherein a periphery of a lower portion of said notched portion comprises a thickened portion in said inner crucible that is thicker than other portions of the inner crucible.

17. A single crystal pulling apparatus according to claim 2, wherein said notched portion contains a vertical upright portion in a lower portion thereof.

18. A single crystal pulling apparatus according to claim 17, wherein said outer crucible has a sloped surface on the inside which slopes inwards, and said inner crucible is positioned with a bottom edge in contact with said sloped surface, and an outer peripheral surface of said bottom edge is a sloping tapered surface which slopes towards the inside of said bottom edge.

19. A single crystal pulling apparatus according to claim 2, wherein said inner crucible has a thick portion at a lower portion around said notched portion, and wherein said thick portion is thicker than the other portions.

20. A single crystal pulling apparatus according to claim 2, wherein said outer crucible has a sloped surface on the inside which slopes inwards, and said inner crucible is positioned with a bottom edge in contact with said sloped surface, and an outer peripheral surface of said bottom edge is a sloping tapered surface which slopes towards the inside of said bottom edge.

21. A single crystal pulling apparatus according to claim 2, wherein said notched portion, at least on an upper edge portion thereof, has a tapered portion where the thickness gradually tapers towards the inside of said notched portion.

22. A single crystal pulling apparatus according to claim 21, wherein said upper edge portion contains a sloped surface, which slopes inwards towards said notched portion from the external surface of said inner crucible to the internal surface.

23. A single crystal pulling apparatus according to claim 2, wherein said notched portion has a maximum width at its base.

24. A single crystal pulling apparatus according to claim 2, wherein a periphery of a lower portion of said notched portion comprises a thickened portion in said inner crucible that is thicker than other portions of the inner crucible.

25. A single crystal pulling apparatus according to claim 1, wherein said inner crucible has a communicating aperture in a side wall serving as said communicating portion, for allowing flow of said semiconductor melt into the inside of said inner crucible when said double crucible is formed, and said communicating aperture employs as said bubble removal means, a tapered portion, at least on an upper edge portion of said communicating aperture, where the thickness gradually tapers towards the inside of said communicating aperture.

26. A single crystal pulling apparatus according to claim 25, wherein said upper edge portion contains a sloped surface, which slopes inwards towards said communicating aperture from the external surface of said inner crucible to the internal surface.

* * * * *